United States Patent [19]
Panigrahi

[11] 3,975,717
[45] Aug. 17, 1976

[54] CHARGE COUPLED DEVICE STACK MEMORY ORGANIZATION AND REFRESH METHOD

[75] Inventor: Godavarish Panigrahi, Piscataway, N.J.

[73] Assignee: Burroughs Corporation, Detroit, Mich.

[22] Filed: Sept. 9, 1974

[21] Appl. No.: 504,067

[52] U.S. Cl. ................. 340/173 R; 307/221 C; 357/22
[51] Int. Cl.² ................................ G11C 11/40
[58] Field of Search ............. 340/173 R, 173 CA; 307/221 C, 222; 317/235 A

[56] References Cited
UNITED STATES PATENTS

| | | | |
|---|---|---|---|
| 3,643,106 | 2/1972 | Berwin | 340/173 SM |
| 3,763,480 | 10/1973 | Weimer | 340/173 SM |
| 3,772,658 | 11/1973 | Sarlo | 340/173 SM |

*Primary Examiner*—Terrell W. Fears
*Attorney, Agent, or Firm*—Manuel Quiogue; Franklin D. Ubell; William B. Penn

[57] ABSTRACT

An extendable memory organization capable of last-in-first-out or first-in-first-out operation comprising a stack of charge coupled device shift registers arranged such that each register shifts data in a direction opposite to that of its adjoining neighbors in the stack. Gating interconnecting the registers is selectively operable to enable read and write operations at either of the stack and up or down shifting of data in the stack. In particular, the gating and control structure permits refreshing the memory by alternately shifting each stored data word up and down between two storage positions in the stack. In one embodiment, gating and control is implemented in a sandwich structure incorporated into the charge coupled shift register channel.

20 Claims, 13 Drawing Figures

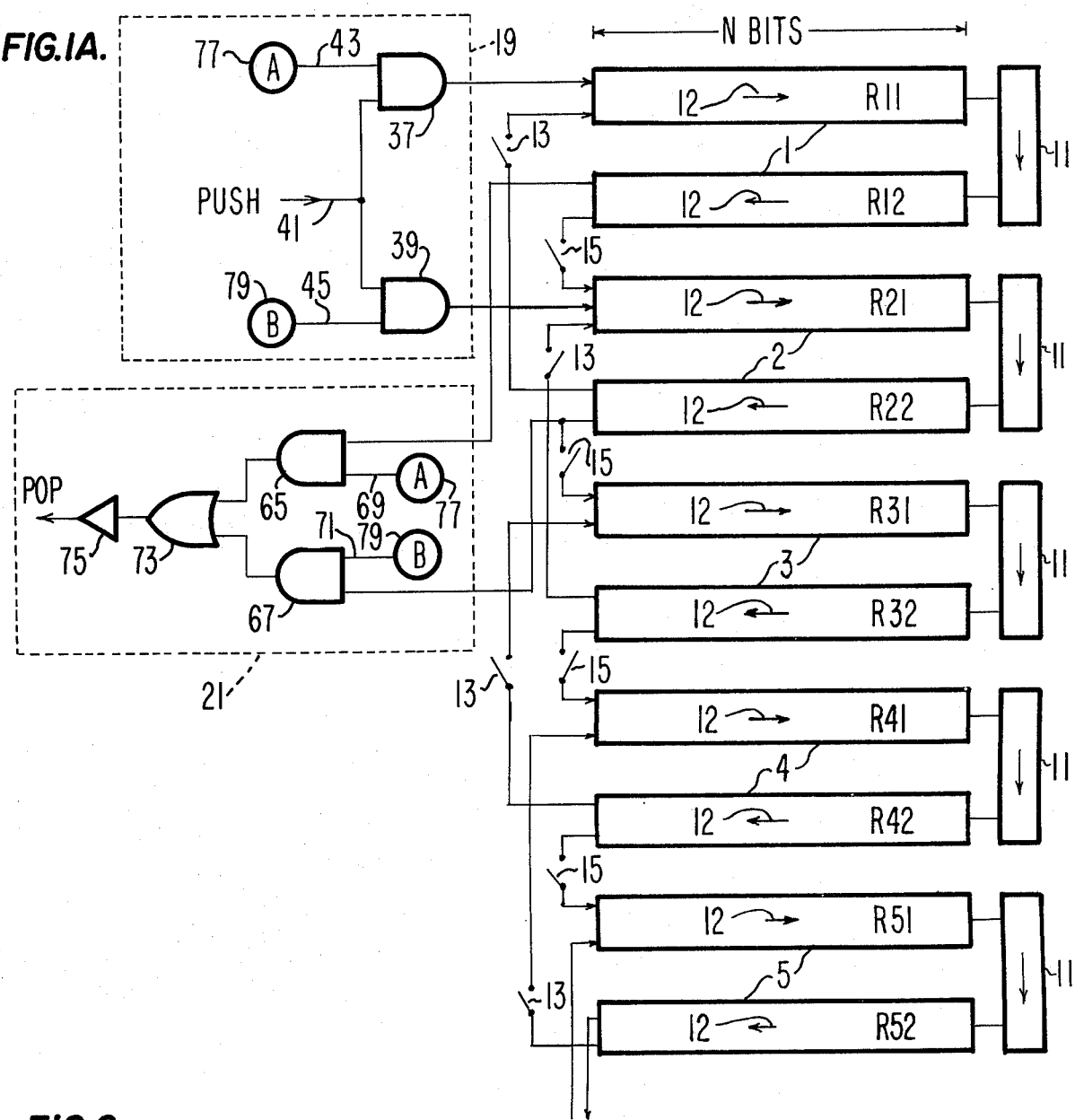
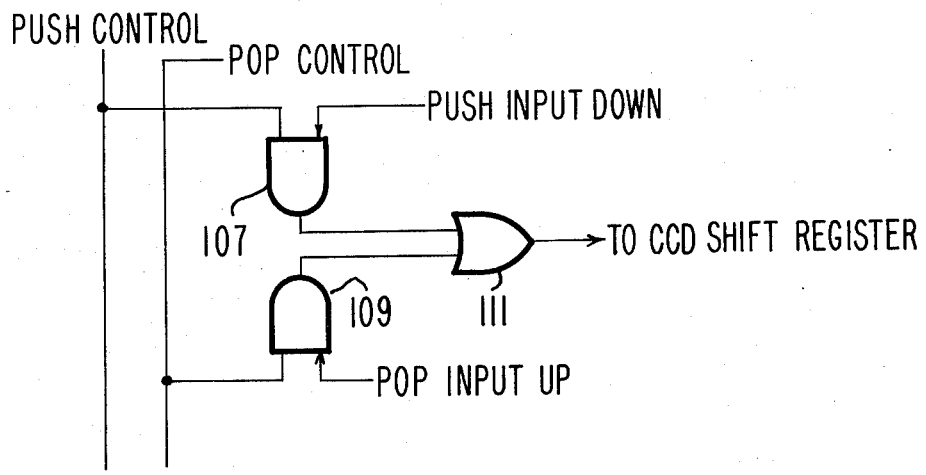

CHARGE COUPLED DEVICE STACK MEMORY ORGANIZATION AND REFRESH METHOD

BACKGROUND OF THE INVENTION

This invention relates generally to computer memory organization and, more particularly, to the organization of a stack memory composed of charge coupled device shift registers and capable of last-in-first-out or first-in-first-out operation. While the invention in its broad aspects may find application in other charge storage memories where refreshing of stored charge is required such as well-known MOS shift registers, the invention is particularly directed to a charged coupled device embodiment.

Charge coupled device shift registers are well-known in the art as shown by U.S. Pat. No. 3,758,794 issued to W. F. Kosonocky on Sept. 11, 1973. In such registers, information is stored as the presence or absence of charge packets of minority carriers in storage cells beneath the electrodes of the register. These packets of minority carriers are initially injected into a register from a source diffusion and are shifted from one electrode to the next by varying the voltage on the register electrodes. Various arrangements for varying the electrode voltage and clocking the registers are possible, using two, three or four phase voltages. Information clocked into the last storage cell of a register may be detected, or it may be transmitted to another register by means of a floating diffusion located between the last register storage cell and a drain diffusion. The purpose of the drain diffusion is to remove the charge packets after the information they represent has been transmitted or detected.

Such shift registers have suggested themselves as particularly suited to stack memory designs. In the past, serial stack memories of the last-in-first-out or first-in-first-out kind have been widely used in computer systems. They have often been carved out of random access memories by software programs, thus complicating the task of the programmer. In other cases, hardware embodiments of stack memories have been built from MOS and other semi-conductor memory structures. However, because of the simplicity and physical size of charge coupled devices, a stack-memory utilizing them and constructed according to an efficient organization plan has many advantages over prior art hardware embodiments. In particular, reduced fabrication costs and increased storage capacity per integrated circuit chip result.

When using charge coupled devices in memory applications, it is necessary to periodically refresh the memory. Otherwise, thermal and other generation of minority carriers cause impairment of the memory contents. In addition, charge transfer inefficiencies require that after a certain number of charge transfers, the charge be regenerated.

Prior art devices have offered several solutions to the refreshing problem. In one, the data of the memory is shifted out of the memory, temporarily stored and then shifted back. Such an approach is overly complicated, wasteful of space and unsuited to stack memory applications. Another method, used particularly in conjunction with charge coupled device shift register structures, involves connecting a shift register or a series of them in a continuous loop through which the stored data is continuously circulated. During this circulation, the data passes through regeneration means, such as the floating diffusion arrangement previously discussed. Such a technique does not lend itself to a simple organization of a last-in-first-out or a first-in-first-out stack where it is desired that the data be maintained in a particular order at all times so that the first or last data items are immediately accessible.

The problem of organizing an efficient structure for refreshing data and transferring data between shift registers in a charge coupled device stack memory is further complicated by a competing concern for minimizing the size of the memory. Two phase charged coupled device structres are simpler and result in a space saving of approximately 20% over three or four phase structures. Translated into integrated circuit terminology, two phase structures result in reduced on-chip complexity and higher bit density per chip. Therefore, to obtain the maximum advantage from using charge coupled device shift registers, it is highly desirable to use two phase structures. However, these structures inherently transfer data unidirectionally, while bidirectional capability is necessary to avoid complicated structure in a serial stack memory designed to operate in either last-in-first-out or first-in-first-out modes. The prior art has not provided a transfer and refresh organization which adpats unidirectional shift registers to bidirectional data transfer while avoiding continuous loop data regenerating schemes.

SUMMARY OF THE INVENTION

It is therefore, an object of the invention to efficiently organize a stack memory from charge coupled device shift registers.

It is another object of the invention to provide a simple and efficient technique for refreshing the contents of such a memory.

It is a further object of the invention to implement a charge coupled device stack memory organization and refreshing technique in a simple and extendable integrated circuit design.

It is a still further object of the invention to facilitate bidirectional serial data transfer in a charge coupled device stack memory comprising unidirectional shift registers.

It is a particular object of the invention to organize a last-in-first-out, first-in-first-out stack memory from a series of unidirectional, two phase charge coupled device shift registers utilizing a refresh technique in which data is alternately shifted up and then down in the stack.

These and other objects and advantages of the invention are accomplished by stacking a series of unidirectional charge coupled device shift registers one upon the other such that the drain of each overlying register lies opposite the source of the register immediately underlying it. At one side of the stack, successive register pairs are connected by conventional charge regeneration means. At the other side, the registers are connected through a modified regeneration and charge injection structure embodying a series of Up and Down gates. These gates are selectively closable in response to POP or PUSH signals to alternately route the shifting data up or down in the stack and through regeneration means, while maintaining the relative order of data in the stack. Additional gating circuitry cooperates with the Up and Down gates to enable extending the stack design and accessing the stack in either last-in-first-out or first-in-first-out modes.

BRIEF DESCRIPTION OF THE DRAWINGS

The foregoing objects and advantages of the invention, together with other objects and advantages obtainable by its use, will be apparent from the following detailed description of the invention read in conjunction with the drawings of which:

FIG. 1A and FIG. 1B comprise a simplifies schematic of the preferred embodiment of the invention.

FIG. 6 is a logic diagram representation of the operation of the sandwich structure of FIG. 4A and 4B and FIG. 5A and 5B.

DETAILED DESCRIPTION OF THE PREFERRED EMBODIMENT OF THE INVENTION

Figure 1B:
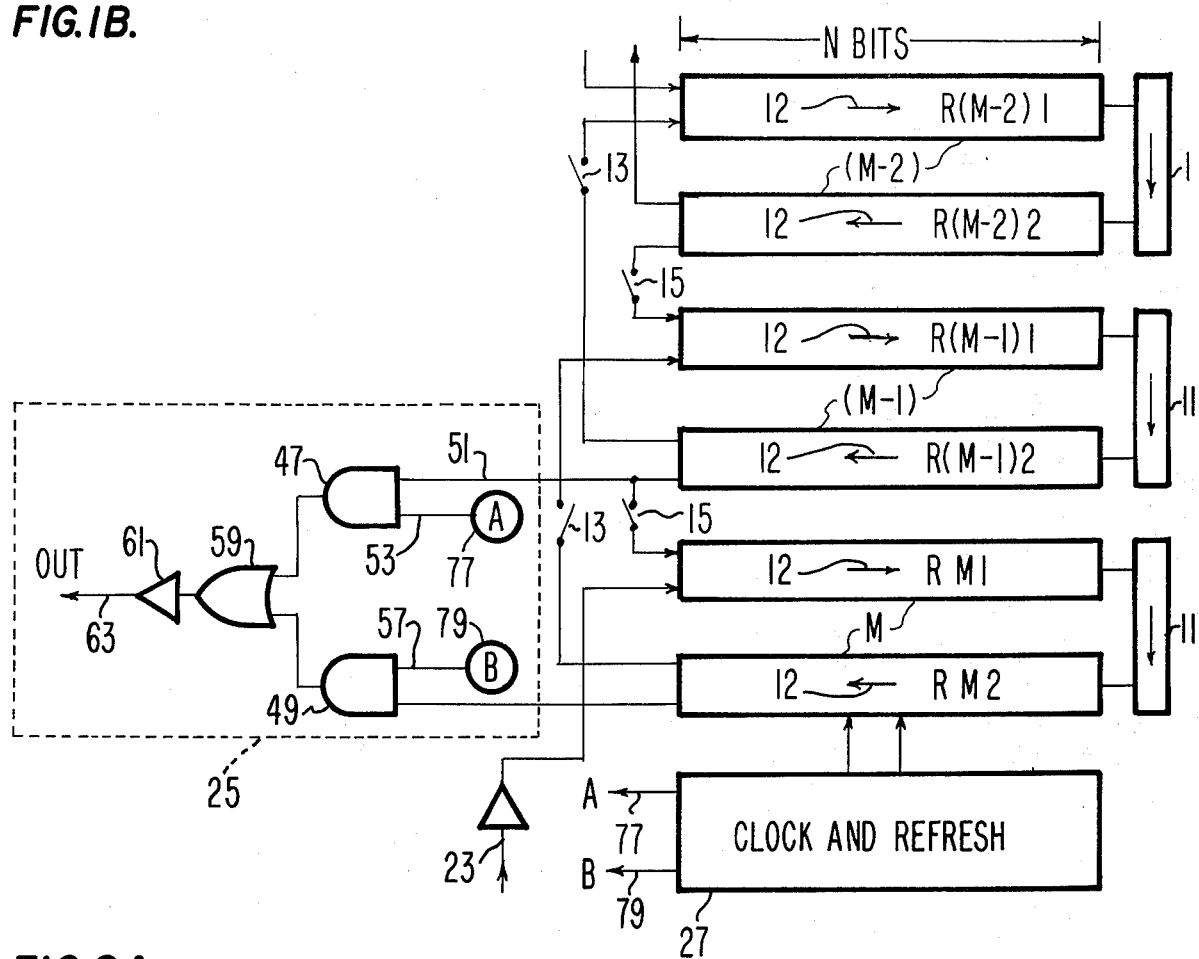

The preferred embodiment of the invention will first be described with respect to FIG. 1A and 1B, the simplified schematic structure of which best illustrates the theory of operation of the stack memory of the preferred embodiment of the invention.

The invention is based upon a stack of an arbitrary number of charge coupled device shift register pairs, 1 through M. At one side of the stack, the registers are connected by conventional regeneration means 11, while at the other side of the stack the registers are interconnected by modified charge regeneration means incorporated in Up gates 13, and Down gates 15. Input and output to the register stack is provided by the PUSH input circuitry 19 and the POP output circuitry 21 at the top of the stack and CHIP POP input circuitry 23 and OUT output circuitry 25 at the bottom of the stack. Finally, clocking and control circuitry 27 controls the clocking of the register pairs 1 through M, the closing of the various gates 13, 15 and functioning of the input and output circuits 19, 21, 23, 25.

The shift registers $R_{11}$ through $R_{M2}$ in the stack of the preferred embodiment of the invention are of the unidirectional, two phase type and have an arbitrary number (n) of storage cells each. Application of a proper two phase clocking signal to each register moves data bits represented by charge packets from one register cell to the next. The registers $R_{11}$ through $R_{M2}$ are organized so that each register shifts data in the opposite direction from the registers above and below it as shown by the arrows 12 in FIG. 1. The registers $R_{11}$ through $R_{M2}$ are further organized in pairs 1 through M, a complete computer word being stored in each pair so that a word is made up of 2n bits. Each register pair 1 through M is thus made up of a first stage $R_{11}, R_{21}...R_{M1}$, and second stage $R_{12}, R_{22}...R_{M2}$. Each pair is connected at one side of the stack by conventional charge regeneration means 11. As shown by kosonocky, U.S. Pat. No. 3,758,794, such charge regeneration requires cooperating elements in each shift register, which have been schematically shown in FIG. 1A and 1B as part of the conventional regeneration means 11 and as integral with the Up and Down gates 13, 15, respectively.

In the preferred embodiment of the invention, each complete word of 2n bits is to be alternately shifted between two adjacent register pairs in order to accomplish refreshing of the stack memory contents. To implement this refreshing technique one more register pair is needed than the total number of words to be stored in the stack. In other words, in M register pairs are present in the stack M-1 words of 2n bits each may be stored. It should be noted that in the preceding and ensuing discussion, the terminology upshifting and downshifting is used for convenience in description only. In an actual planar circuit embodiment, each shift register would lie adjacent the next in a plane, and data would move through the registers in that plane.

The stack may then be characterized as being in either one of two states. In one state the first register pair 1 and each succeeding register pair 2 through M-1 except the last pair M are loaded with a word, and refresh is accomplished by moving each word down one register pair. The stack is thereby brought to a second state where the first register pair 1 is empty. The next refresh operation moves each word back up one register pair into the first refresh state where the first register pair 1 is loaded with a word and the last pair M is empty. Hereafter, the first refresh state will be referred to as State A and the second as State B.

The clocking and control circuitry 27 monitors the data movement in the register pairs 1 through M and produces various control signals in cooperation with other computer circuitry not forming part of the present invention. The construction and operation of such control circuitry to produce signals as hereafter described is well known in the art. The control circuitry 27 may selectively produce signals denoted as PUSH and POP signals. It further produces signals indicative of each refresh state, which may be denominated state A singals and State B signals. A State A signal endures until State B is reached--that is, until the last bit is moved out of the first register pair 1 into the second register pair 2. A State B signal is then produced and maintained until State A is again reached. These signals participate in the control necessary to facilitate alternate Up-Down refreshing operations and memory access. The nature of this participation will become apparent after the more detailed discussion of the refreshing operation which follows.

Figure 2A:
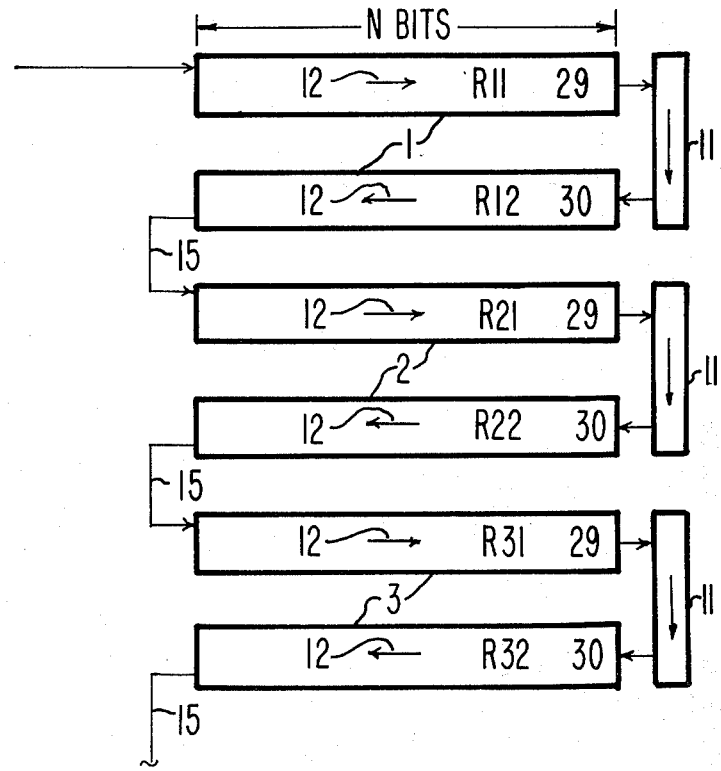
FIG. 2A and FIG. 2B comprise a schematic view of the data transfer paths formed in the embodiment of FIG. 1A and 1B in one refresh mode.
Figure 2B:
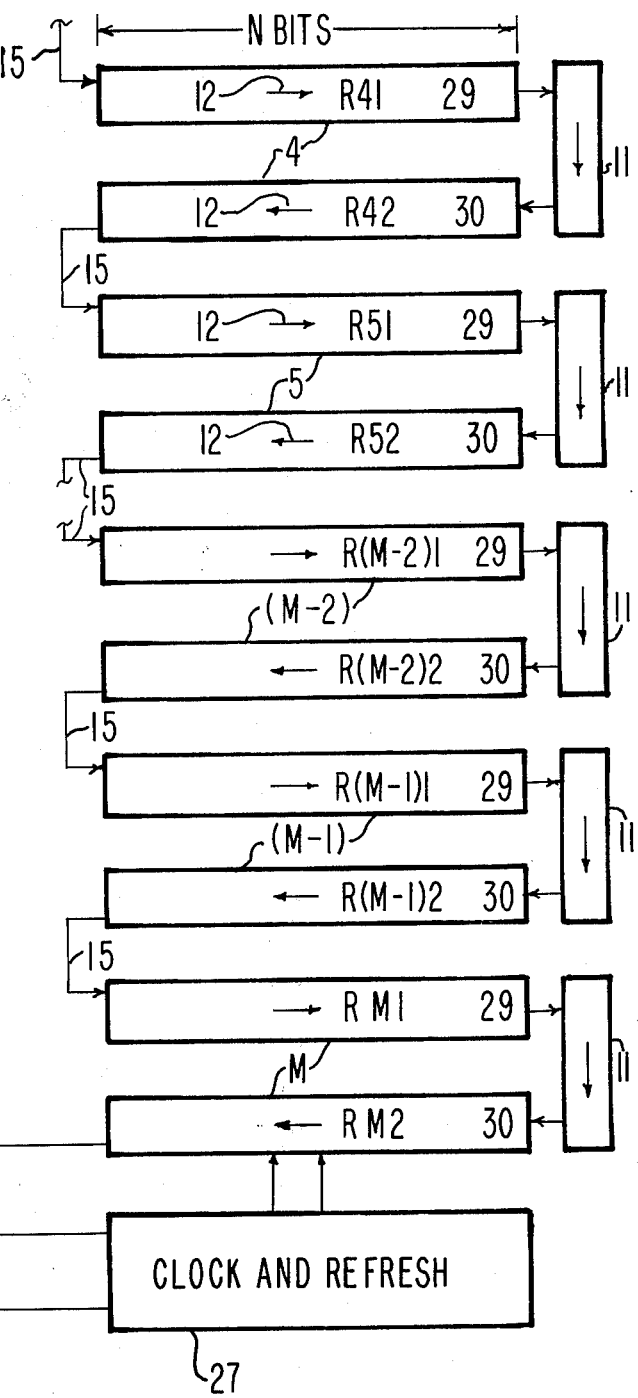

Assuming the stack is in State A and it becomes necessary to refresh the stored data, a PUSH signal is produced by the control circuitry 27 and causes the Down gates 15 to close. Meanwhile, the Up gates 13 are open. When the Down gates 15 are closed by a PUSH signal, a serpentine path (FIG. 2A and 2B) is formed through the registers $R_{11}$ through $R_{M2}$ of the stack via the regeneration means 11 and the Down gates 15. Thereafter, application of a series of 2n clock pulses will shift each word through the conventional regeneration means 11 and the Down gates 15 and down into the next respective adjacent register pair, thus refreshing each word and placing the stack in State B.

Figure 3A:
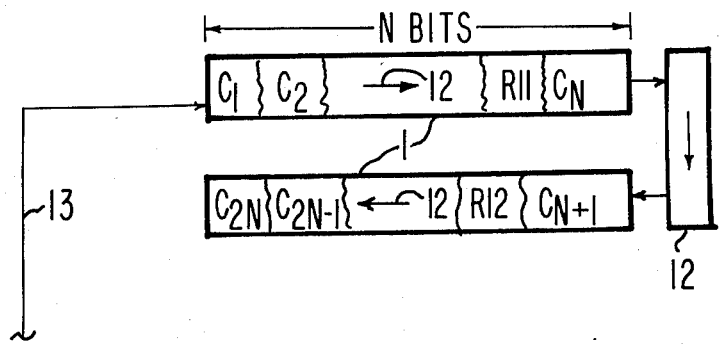
FIG. 3A and FIG. 3B comprise a schematic view of the data transfer paths formed in the embodiment of FIG. 1A and 1B in the alternate refresh mode.
Figure 3B:
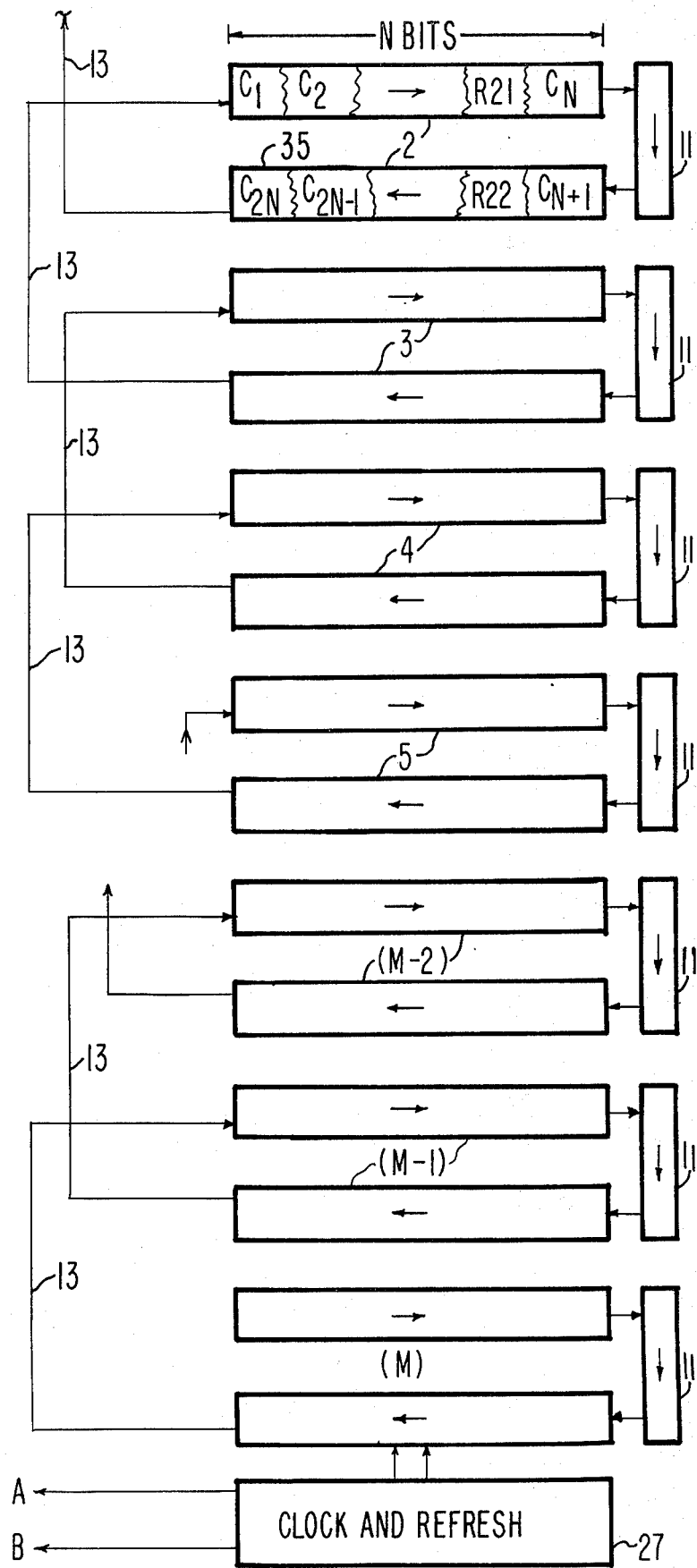

After the stack has remained in State B for a certain time, refreshing again becomes necessary. The Up gates 13 may then be closed by a POP signal and the Down gates 15 opened by removing the PUSH signal. Delivery of another series of 2n clock pulses shifts each word bit by bit back into the adjacent upper register pair. The paths formed by delivery of the POP signals are shown more clearly in FIG. 3A and 3B. To illustrate the movement of the stored bits with the Up gates 13 closed, the last bit 35 (FIG. 3B) in the second stage $R_{22}$ of the second register pair 2 is shifted by the first clock pulse into the first cell $C_1$ of the first stage $R_{11}$ of the first register pair 1. Further clock pulses then successively shift that bit through the first stage $R_{11}$, the regeneration means 11 connecting the first stage $R_{11}$ and second stage $R_{12}$ and finally, after the 2n-th clock pulse, into the 2n-th cell, $C_{2n}$ of the second stage $R_{12}$ of the first register pair 1.

Up to this point, the stack has been considered to be loaded with data for purposes of discussing the interconnection of the registers $R_{11}$ through $R_{M2}$ in the stack and the stack refresh operation. In order to load the stack, allow its operation in either last-in-first-out or first-in-first-out modes and permit it to be easily extended by simple connection to similar stacks, the PUSH and CHIP POP input circuitry 19, 33 and POP and OUT output circuitry 23, 25 previously mentioned is necessary.

In entering data into the stack, the following approach is used in the preferred embodiment of the invention. If the stack is in State A, the first word is stored in the first register pair 1, and entering data should be pushed into the first stage $R_{11}$ of the first register pair 1 in order to maintain the proper sequence in the stack. This requirement is met by closing the Down gates 15 with a PUSH signal, and clocking a word into the first register pair 1. The word that previously occupied the first register pair 1 and each of the other words in the stack are clocked into the next respective lower register pairs concurrently with the entry of the new data. If the stack is in State B, the first word is located in the second register pair 2, and it is desirable that an entering word be pushed into the second register pair 2 in order to accomplish a refresh and keep the first register pair 1 open for a subsequent return to State A. A PUSH signal is therefore generated, closing the Down gates 15, and the entering word is clocked into the second register pair 2 while the succeeding words are shifted down one register pair in the stack.

To control the entry of data into either the first register pair 1 or second register pair 2, as described in the preceding paragraph, first and second two-input PUSH AND gates 37, 39 are utilized in the PUSH circuitry 19 of the preferred embodiment of the invention (FIG. 1). Each of these AND gates 37, 39 receives a first input from a data entry line 41. The second input 43 of the first PUSH AND gate 37 is connected to a State A signal line 77, while the second input 45 of the second PUSH AND gate 39 is connected to a State B signal line 79. The output of the first PUSH AND gate 37 is coupled to the first stage $R_{11}$ of the first register pair 1, and the output of the second PUSH AND gate 39 is connected to the first stage $R_{21}$ of the second register pair 2. Thus, in State A, data is enterable only into the first register pair 1, via the enabled first PUSH AND gate 37 and in State B data is enterable only into the second register pair 2 via the enabled second PUSH AND gate 39.

To allow the stack to operate in a first-in-first-out mode and permit memory extension through output to another stack, the contents of the last two register pairs M, M-1 should be accessible since the first word pushed into the stack may be in either register pair M or M-1 depending on the refresh state. Again, two AND gates 47, 49 are used to provide selective access. The first OUT AND gate 47 has an input 51 from the second stage $R_{(M-1)}2$ of the next to last shift register pair M-1 and a second input 53 from the State A signal line 77. The other OUT AND gate 49 has one input 55 from the second stage $R_{M2}$ of the last shift register pair M and another input 57 from the State B signal line 79. These two OUT AND gates 47, 49 feed an OR gate 59, which outputs through an amplifier 61.

Thus, in State A, the first word placed into the stack has been shifted into the next to last register pair M-1. Of course, State A signals are present, enabling the first OUT AND gate 47. If data is to be read out of the memory, the UP and DOWN gates 13, 15 may be opened. Data may then be read out of the memory via the enabled first OUT AND gate 47 and detected at the amplifier output 63 in response to successive clocking of the data in the next to last register pair M-1. Holding the gates 13, 15 open prevents the shifted out data from being maintained in the stack by Up or Down shifting into the adjacent register pairs M-2, M.

In State B, data may be read out of the last register pair M via the second OUT AND gate 49 by similarly opening the Up and Down gates 13, 15 and clocking the last register pair M or by closing the Down gates 15 and clocking all the registers 1 through M. In the latter case, each word in the stack is shifted down one register pair, the word in the next-to-last register pair M-1 taking the place of the data word shifted out of the M register through the enabled second OUT AND gate 49.

To operate the stack in the last-in-first-out mode and facilitate Up-shifting data into another stack memory in an extended design, gating circuitry similar to that just described for first-in-first-out operation may be used in the preferred embodiment of the invention. First and second POP AND gates 65, 67 fed by the output (drain) ends of the second stages $R_{12}$, $R_{22}$ of the first and second register pairs 1, 2, respectively, may thus be utilized. The first POP AND gate 65 is supplied with an input 69 from a State A signal line 77, and the second POP AND gate 67 is supplied with an input 71 from State B signal line 79. Again, the AND gates 65, 67 feed on OR gate 73 and an amplifier 75.

Thus, in State A, the last word loaded into the stack is in the first register pair 1. It may be read out of the stack by maintaining the Up gates 13 closed and Down gates 15 open while clocking the registers 2n times. Each word in the stack is thus upshifted one register pair, while the first word can only exit via the first POP AND gate 65.

If the stack is in State B, the last word can be read out of the second register pair 2. This read-out may be accomplished by opening both the Up and Down gates 13, 15 and clocking only the second register pair 2. Data will then be outputted through the enabled second POP AND gate 67 and the OR gate 73.

While the preceding description indicates the data transfer scheme and refreshing method of the preferred embodiment of the invention, it does not show a structural adaptation particularly suited to single slip integrated circuit fabrication. Such an adaptation is shown in FIG. 4A and FIG. 4B.

Figure 4A:
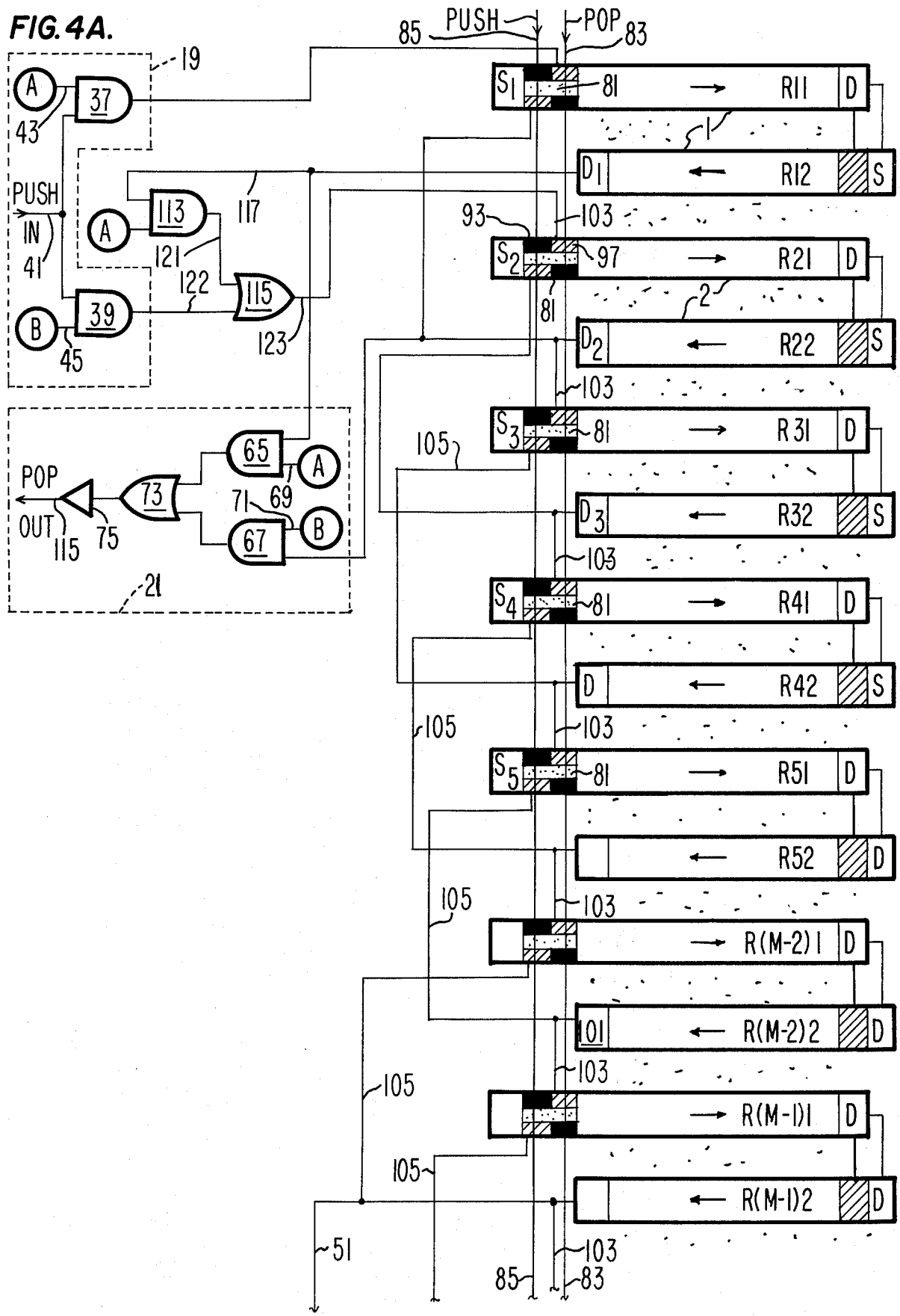
FIG. 4A and FIG. 4B comprise a schematic view of a particularly advantageous single chip integrated circuit implementation of the embodiment of FIG. 1A and 1B.
Figure 4B:
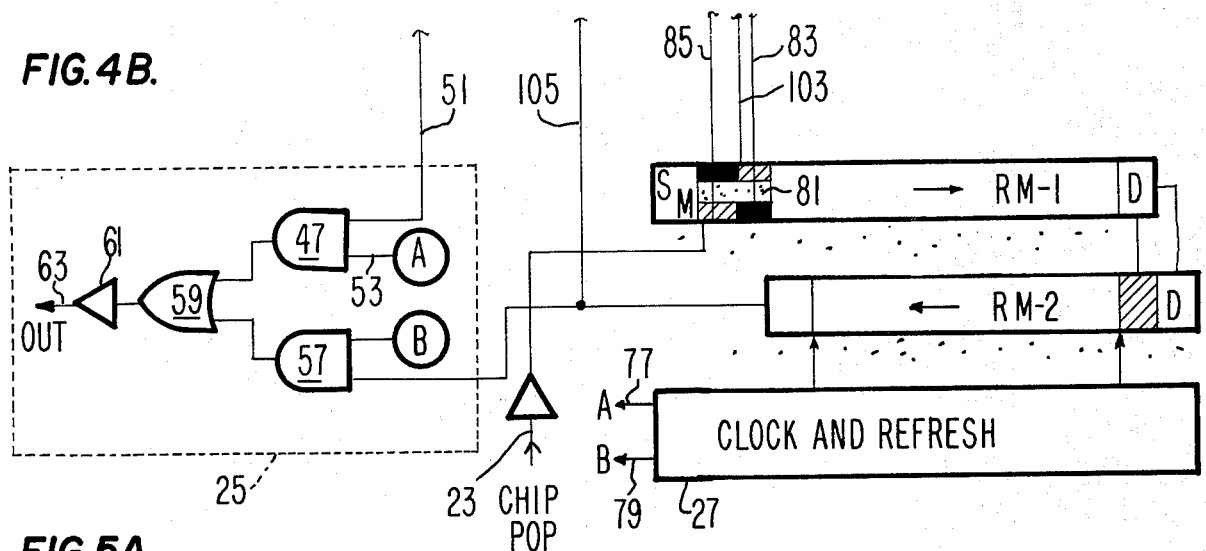

Several general features are notable in the stack design of FIG. 4A and 4B. First, the Up and Down gates 13, 15 of FIG. 1A and 1B have been directly implemented into the shift register channels $R_{11}$ through $R_{M2}$ by means of the sandwich structures 81 constructed between the shift register source diffusions $S_1$ through $S_n$ and the shift register channels $R_{11} \ldots R_{M2}$. The sandwich structures 81 are subject to control via a common POP line 83 and a common PUSH line 85. Secondly, the POP output logic 21 and PUSH input logic 19 of FIG. 1A have been modified to remove the situation where three inputs to the first stage $R_{21}$ of the second shift register pair 2 are required.

Figure 5A:
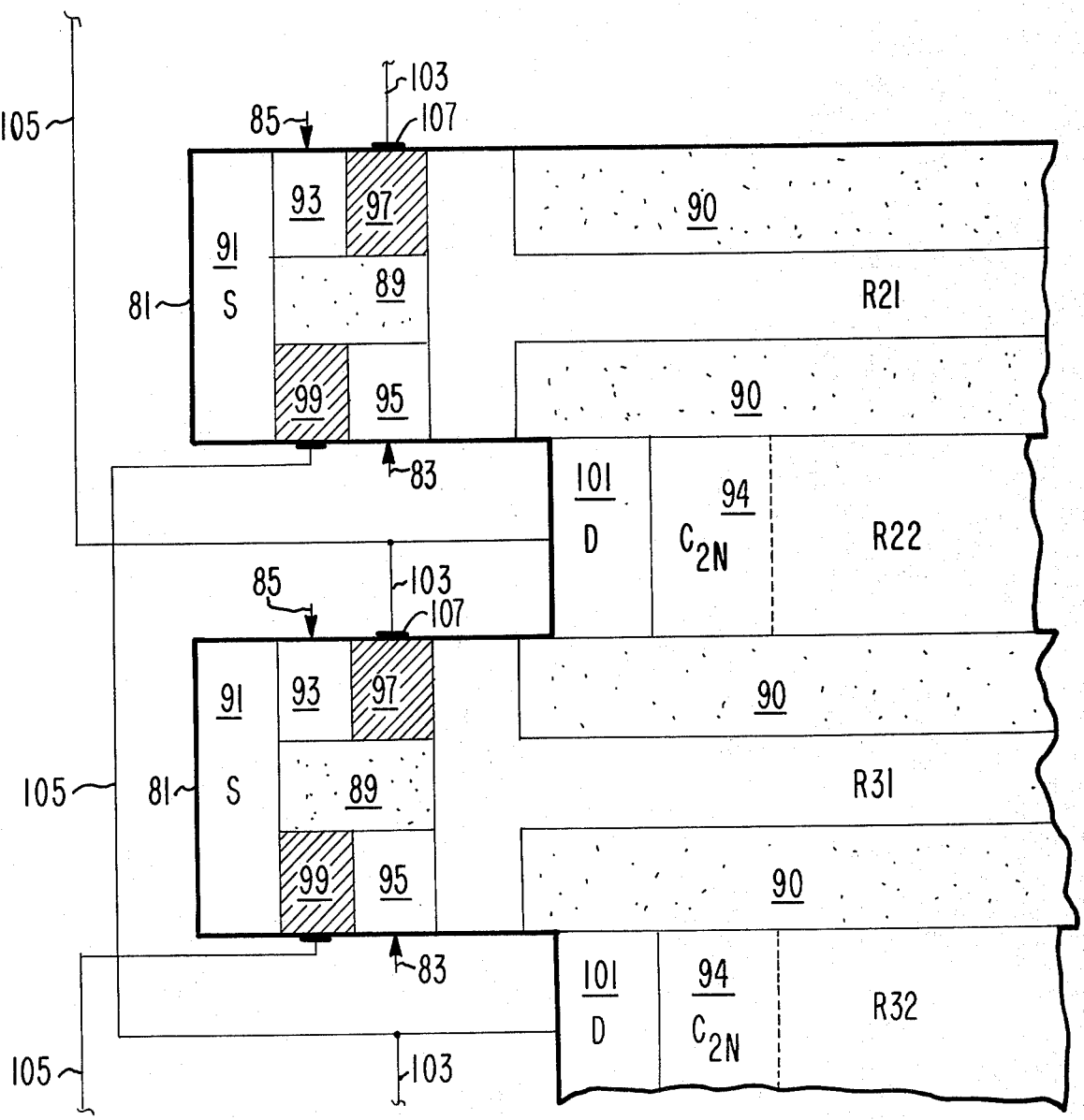
FIG. 5A and FIG. 5B comprise an enlarged, detailed view of the sandwich gating and control structure shown in FIG. 4A and 5B.
Figure 5B:
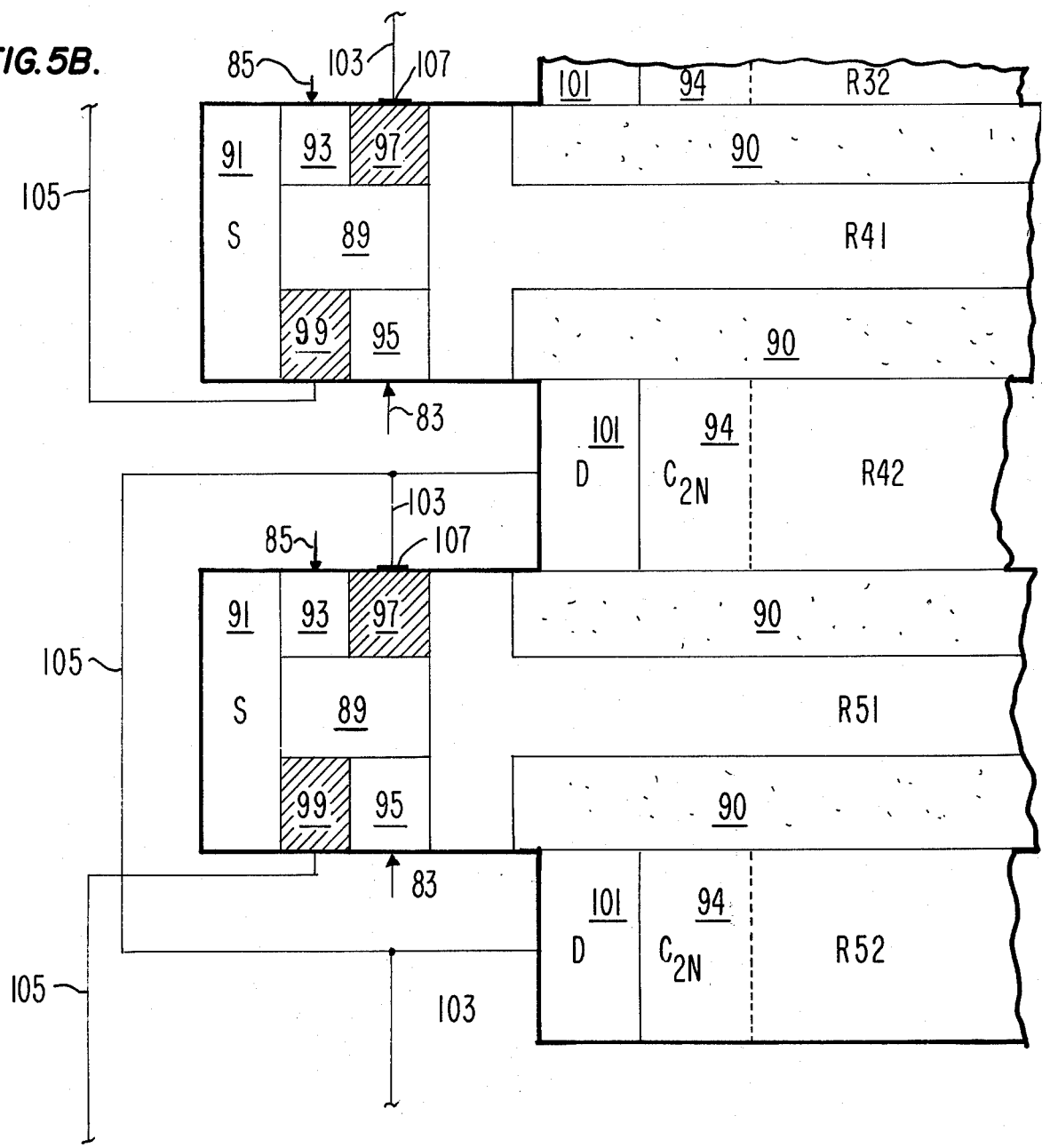

The sandwich structures 81, which facilitate the Up and Down shifting previously discussed, are shown in more detail in FIG. 5A and 5B. They each comprise a channel stopper resion 89, a source diffusion region 91, two aluminum electrodes 93, 95 and two silicon electrode regions 97, 99. As a comparison of FIGS. 4A, 4B, 5A and 5B shows, the sandwich need not conform to the width of the shift register channel.

Each source diffusion 91 forms a T with a channel stopper region 89 and is constructed and operated as in the prior art to provide a site for charge injection into each first stage shift register channel $R_{11}, R_{21}, R_{31} \ldots R_{M2}$. The two stopper regions 89, 90 define the shift register channels $R_{11} \ldots R_{M2}$ and the charge conducting paths from the sources 91 into the channels $R_{11} \ldots R_{M2}$ by providing a region where minority carriers will not be generated and where clock voltages will have no effect. In the prior art, such stopper isolation has been accomplished by increasing the doping a few orders of magnitude over the channel doping.

Two serial paths are defined from the source region 91 of each sandwich 81 into the associated shift register channel. On the upper side of each channel stopper 89, a path is defined by aluminum upper gate electrode 93 and a silicon upper gate electrode 97. On the underside of the channel stopper 89, a serial path between each source 91 and each associated shift register channel is provided by a lower aluminum gate electrode 95 and lower silicon gate electrode 99.

These electrodes are connected by conventional means to the PUSH and POP control lines 83, 85 and drain outputs 101 of the adjacent shift registers to permit the controlled, alternate Up and Down data refresh transfer previously described. The upper aluminum electrodes 93 are connected to a common PUSH line 85 and aluminum electrodes 95 are connected to a common POP line 83. These aluminum electrodes 93, 95 may inhibit or allow charge injection according to the presence or absence of a POP or PUSH control signal. Each upper silicon gate electrode 97 is connected to the drain diffusion 101 of the second stage $R_{22}, R_{32}, R_{42}$ (FIG. 5A, 5B) of the respective preceding shift register pair by Down lines 103. Each lower silicon gate electrode 99 is connected to the drain diffusion 101 of the second stage $R_{32}, R_{42}, R_{52}$ (FIG. 5A, 5B) of the respective immediately following shift register pair by the Up lines 105.

Each of these drain to silicon connections is constructed with regeneration means, for example, as shown in Kosonocky, U.S. Pat. No. 3,758,794. Thus, a floating diffusion in a drain region 101 may be used to transfer a data signal via an aluminum contact 107 to a polysilicon region 97, which is highly doped so as to constitute a good conductor. Once an enabling signal is applied to any aluminum gate electrode 93, the presence or absence of a data signal in the last storage cell 94 of a preceding register second stage $R_{22}, R_{32}$, or $R_{42}$, controls injection of charge into the respective succeeding register first stage $R_{31}, R_{41}, R_{51}$ from the associated source diffusion 91, thus effecting a data transfer between shift register stages.

The proper operation of the above serial sandwich gate structure 81 permits alternate Up-Down shifting and refreshing of data. If a PUSH control signal is not applied to the PUSH control line 85 and hence to the upper aluminum electrodes 93, each upper serial channel 93, 97 is effectively cut off since no charge injection is possible from the sources 91. Thus, no downshifting of data via the Down lines 103 is possible. Conversely, applying a PUSH signal will open the channel 93, 97 and allow downshifting of data. If a POP control signal is not applied to the POP control line 83, no charge injection from the second stage $R_{22} \ldots R_{M2}$ of the lower registers via the Up lines 105 is possible since the lower channels 95, 99 are cut off. Again, applying a POP signal permits charge injection and transfer of data into the adjacent upper registers pairs through the Up lines 105.

Of course, all data transfers are driven by appropriate clock signals as already described. Also, the choosing of a proper voltage for the POP and PUSH signals in order to control charge injection is well known in the art.

From another viewpoint, the operation of the sandwich structure of FIG. 4A and 4B and FIG. 5A and 5B may be analogized to conventional logic circuitry shown in FIG. 6. Each upper serial path 93, 97 and lower serial path 95, 99 corresponds to a two-input AND gate 107, 109, respectively, and the ability of either serial path 99 95; 93, 95 to inject a data (charge) signal into a shift register channel is equivalent to "ORing" the outputs of the two AND gates 107, 109 by means of an OR gate 111.

As can be seen, the sandwich structure 81 of the preferred embodiment of the invention is simple and highly symmetrical and lends itself to a simple integrated circuit embodiment. However, incorporation of three leads into the first stage $R_{21}$ of the second register 2 as shown in FIG. 1A would complicate the structure. While the gating scheme already described with respect to FIG. 1A and 1B is still employed, the necessity of using three inputs rather than two is eliminated by the structure of FIG. 4A and 4B as hereafter detailed.

The extra input is eliminated by adding an AND gate 113 and an OR gate 115 to interrelate the POP output circuitry 21 and PUSH input circuitry 19 previously described. The AND gate 113 receives one input 117 from the drain 101 of the second stage $R_{12}$ of the first register pair 1 and one input 119 from the State A signal line 77. The OR gate 115 receives one input 121 from the AND gate 113 and one input 122 from the second PUSH AND gate 39. The output 123 of the OR gate 115 is then connected to the upper silicon electrode 97 of the sandwich element 81 in the first stage $R_{21}$ of the second shift register pair 2. Therefore, when the stack system is in State A and the first word in the stack is by definition in the first register pair 1, the AND gate 113 is enabled, providing a Down path through the OR gate 115 to the first stage $R_{21}$ of the second register pair 2. This path may be used in a Down cycle of refresh or in stack loading operations. At the same time, the second PUSH AND gate 39 is still coupled through the OR gate 115 to the first stage $R_{22}$ of the second register pair 2.

To summarize, the operation of the stack is controlled by State A, State B, PUSH, POP, and CLOCK signals. In all cases, the CLOCK signals advance data bits in the form of charges or absence of charges unidirectionally through the shift register pairs 1 through M. The State A, State B, PUSH and POP signals route the undirectionally shifting data to accomplish ordering, input and output of data and data refreshing.

If the stack is to be loaded, a PUSH signal is applied. All Down paths 105 are thereby enabled, permitting serial data transfer into the lower registers of the stack. If the stack is in State A, the first PUSH AND gate 37 is enabled, while the second PUSH AND gate 39 is disabled. Data in the form of charge may then be injected through the upper silicon electrode 97 into the first stage $R_{21}$ of the first register pair 1 from the first PUSH AND gate 37. If the stack is in State B, the second PUSH AND gate 39 is enabled, and data is shifted similarly into the first stage $R_{21}$ of the second register pair 2 through the second PUSH AND gate 39.

If data is to be withdrawn from the stack in last-in-first-out fashion, it may be outputted from either the first or second register pair 1, 2. In State A, a POP signal may be applied, enabling upward data transfer via the Up lines 105 and lower serial paths 95, 99. With the transfer paths so enabled, clocking causes the data word in the second register pair 2 to shift into the first register pair 1, the word in the third register pair 3 to shift up into the second register pair 2 and so on, while the word originally in the first register pair 1 is shifted out via the first POP AND gate 65. The absence of a PUSH signal at the upper aluminum electrode 93 of the first stage $R_{21}$ of the second register pair 2 prevents the word orginally in the first register pair 1 from being shifted into the second register pair 2 via the AND gate 113, OR gate 121 and upper silicon electrode 97 connection. In State B, last-in-first-out operation may be accomplished by withholding both POP and PUSH signals and clocking only the second shift register pair 2. Output may then be provided from the second shift register pair 2 via the second POP AND gate 67 while avoiding shifting the outputted data into either the first or third register pairs 1, 3.

If data is to be withdrawn from the stack in first-in-first-out fashion, it may be outputted from either the last register pair M or next to last register pair M-1. In State A, the next to last register M-1 may be separately clocked while the Up and Down paths 103, 105 are blocked by withholding PUSH and POP signals. The last word in the stack is thereby clocked out through the first OUT AND gate 47. In State B, a POP signal may be applied closing all the Down paths 103 and the entire stack clocked 2n times. Each data word is thereby moved down one register, and the last word in the stack is simultaneously clocked out of the stack through the second OUT AND gate 49.

When refresh becomes necessary, all access to the stack is inhibited. If the stack is in State A, a POP signal is applied, and a sequence of 2n clock signals causes each word to be downshifted by one register pair through the charge regeneration means 11 associated with the downward path as previously described with respect to FIG. 1A, 1B, 2A and 2B. If the stack is in State B, a PUSH signal is applied and a sequence of 2n clock signals causes each word to upshift one register pair through the charge regeneration means associated with the upward paths as previously discussed with respect to FIG. 1A, 1B, 3A and 3B.

Figure 7:
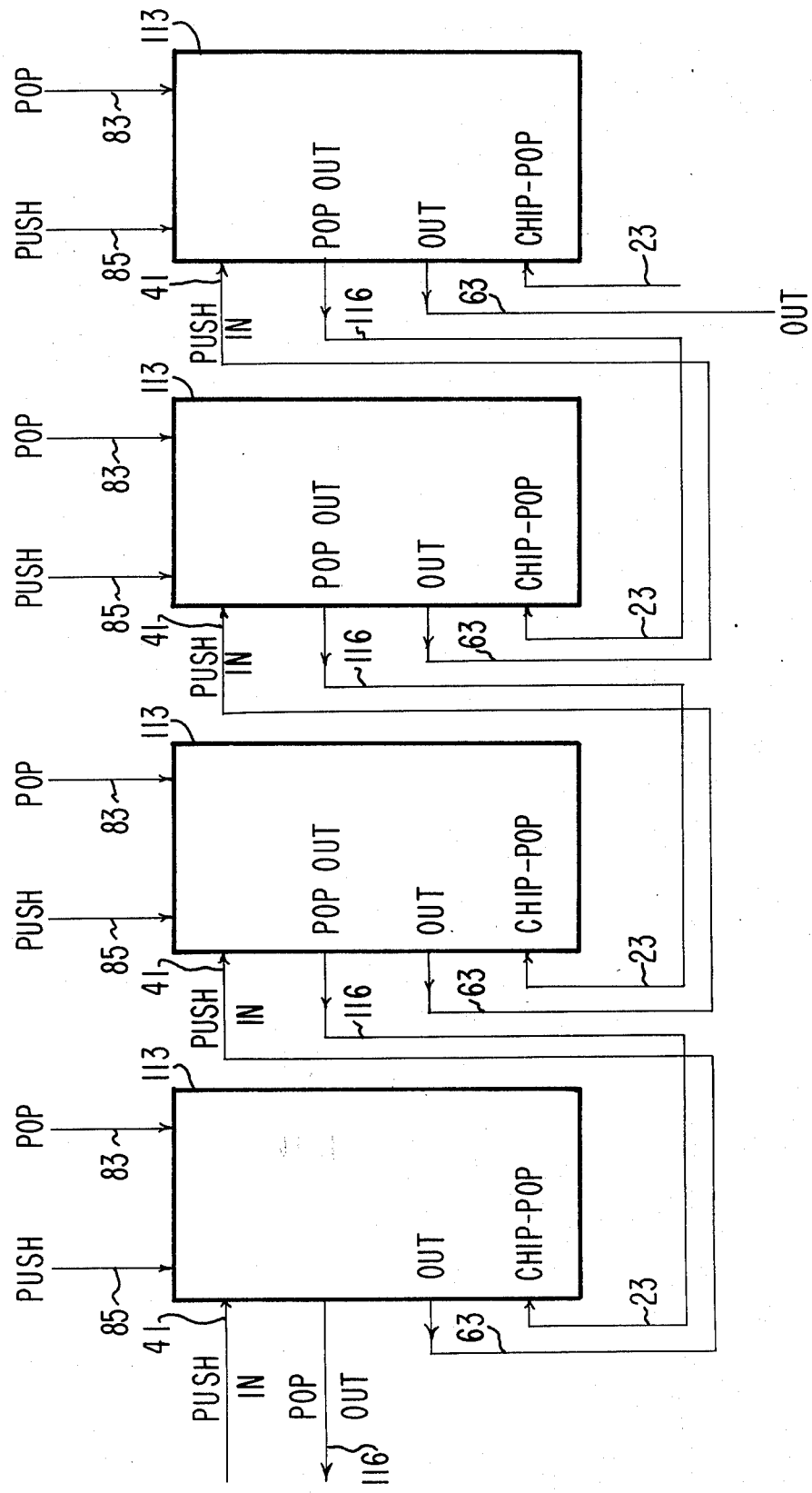
FIG. 7 is a schematic of a design extension of the preferred embodiment.
Figure 8:
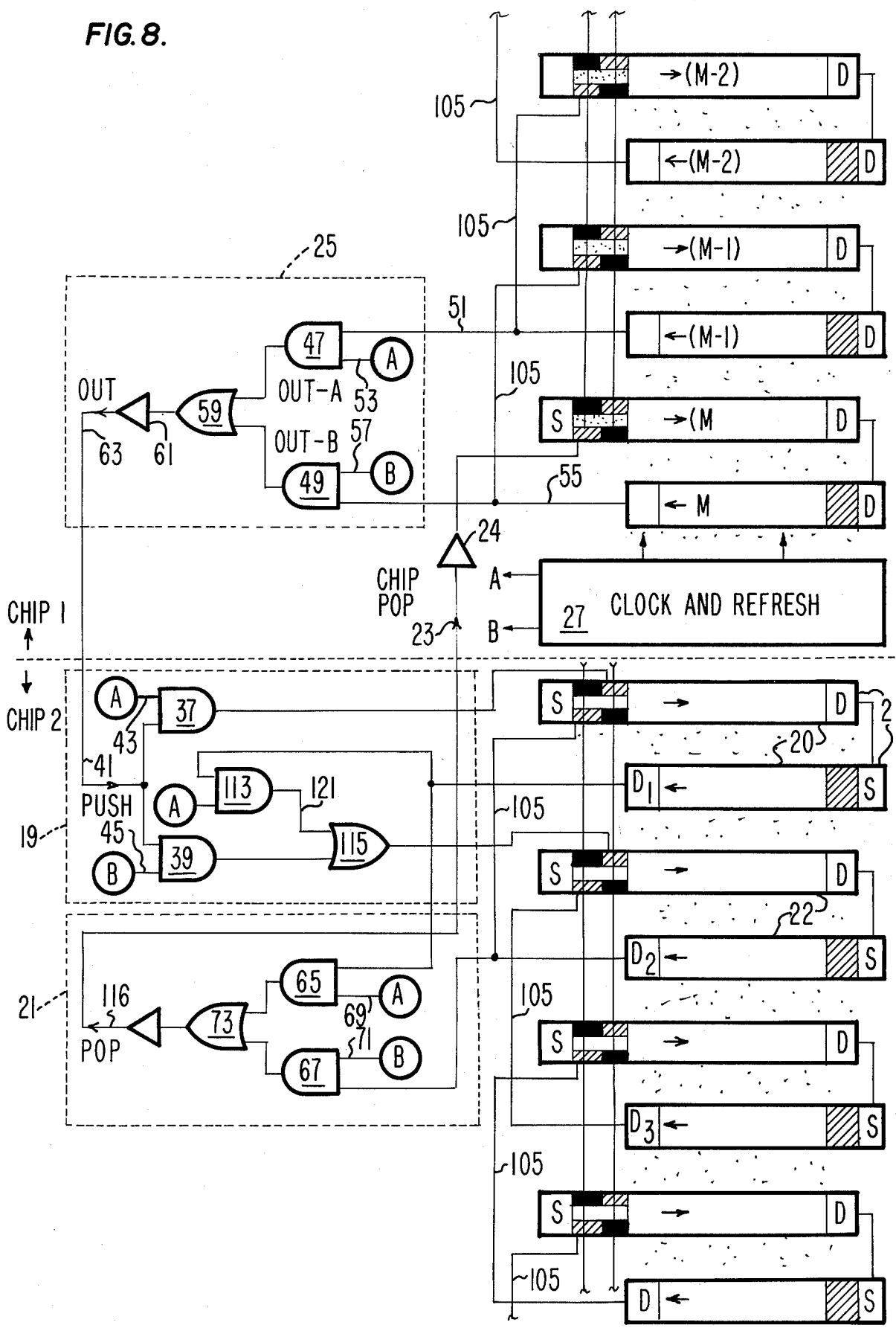
FIG. 8 is a schematic diagram showing in detail the logic connection between two chip elements of the design extension of FIG. 7.

The stack structure of the preferred embodiment of the invention may be advantageously constructed on a single chip. When so constructed, the PUSH and CHIP POP input circuits 19, 23 and POP and OUT output circuits 21, 25 are perfectly compatible to facilitate extension of the stack by simple interchip connections as shown in FIG. 7 and FIG. 8. The OUT terminal 63 of each chip 113 is connected to the PUSH input 41 of the next succeeding chip 113, and the POP output 116 of each succeeding chip 113 is connected to the CHIP POP connection 23 of the preceeding chip 113. As hereafter described, these connections and circuitry permit up and down data transfer according to the scheme of the previously discussed one chip stack memory organization, while assuring that no data is lost.

During a downshift of data, a signal is applied to the PUSH line 85 to allow charge injection from the sources 91 through the upper aluminum electrodes 93. In addition, a State A signal is also supplied. To consider the cooperation of the OUT and PUSH circuitry 19, 25 during a downshift, assume that the stack has been filled to the M-1 stage. Considering a downshift of 2n bits (one word), a word in the next to last register M-1 is shifted through the first OUT AND gate 47 and the first PUSH AND gate 37 of the second chip and into the first register pair 20 of the second chip. That word is also shifted into the last register M of the first chip.

This dual presence of data in the register pair and first register pair 20 is necessary so that data will not be lost in the event of a subsequent upshift, for example, in refreshing. In such an upshift, a POP signal is applied to the POP control line 83 opening the lower serial channels 95, 99, and a State B signal is applied. Thus, an UP path exists from the second register pair 22 of the secoond chip through the POP output 116 and CHIP POP input 23 to the last register M of the first chip. However, no path is available from the first register pair 20 of the second chip to the first chip or the second register pair 22 of the second chip because the AND gate 113 and the first POP AND gate 69 are disabled. When the registers are clocked, the data in the first register pair of the second chip is thus lost. At the same time, however, the identical data in the M register of the first chip is upshifted into the M-1 register, preventing any data loss and maintaining data in order. Concurrently, data from the second register pair 22 of the second chip is shifted into the first register pair 20 via an Up-line 105 and also into the M register pair via the second POP AND gate 67, the OR gate 73, the CHIP POP amplifier 24 and the lower serial path 95, 99, again establishing redundancy between the M register and the first register pair 20 of the second chip.

The particularly advantageous nature of the gating scheme of the preferred embodiment of the invention is now apparent. Two simple connections facilitate shifting of data up and down between two charge coupled device stack memory chips without loss of data. Write-in and read-out of data may be accomplished just as already described for the single chip memory stack.

In general, the stack structure and organization of the preferred embodiment of the invention admits of great flexibility in the data transfers and the input-output operations which may be accomplished. All that is necessary is that proper control signals and clocking sequences be applied. Therefore, the above description has not attempted to exhaust the possible data transfers which might be effected in the preferred embodiment of the invention. However, from the structure, operation and control of the stack memory as disclosed, one of ordinary skill in the art could easily accomplish many variations in operation and organization of the described preferred embodiment without departing from the scope and spirit of the invention. It is therefore to be understood that, within the scope of the appended claims, the invention may be practiced other than as specifically described.

What is claimed is:

1. A data storage device comprising:
   a plurality of shift registers wherein data bits are represented by packets of stored charge, each said register having an input end and an output end, said registers being stacked one next to the other and oriented and clocked such that each register shifts in a direction opposite that of the registers adjoining it; and
   means selectively operable for interconnecting said registers for enabling downshifting each of said data bits through said registers and regenerating each of said data bits or upshifting each of said data bits through said registers and regenerating each of said data bits.

2. The data storage device of claim 1 wherein said interconnecting means further enables maintaining the serial order of said data bits in said registers at completion of said down-shifting or said upshifting.

3. The data storage device of claim 2 further including:
   means for entering data bits into osaid stack of shift registers;
   means for reading out the last series of data bits entered into said stack; and
   means for reading out the first series of data bits entered into said stack.

4. The data storage device of claim 3 further including means for entering data bits into the last register of said stack.

5. The data storage device of claim 2 wherein each consecutive pair of said shift registers stores bits comprising a data word, the first register of each of said pairs comprising a first stage for storing the first half of a data word and the second register of each of said pairs comprising a second stage for storing the second half of that same data word.

6. The data storage device of claim 4 wherein said shift registers comprise charge coupled device shift registers and wherein said means for interconnecting said registers for downshifting, upshifting, and regenerating said data bits comprises:
   charge regeneration means at the output end of each of said shfit registers;
   means for enabling trnasfer of said data bits from the output end of each said first stage register through said regeneration means to the input end of the respectively pairs said second stage register;
   down gate means for enabling transfer of said data bits from each output end of each second stage register through said regeneration means to the input end of the first stage register of the respective succeeding register pair;
   up gate means for enabling transfer of said data bits from the output end of each second stage register through said regeneration means to the input end of the first stage register of the respective preceding register pair; and
   means for selectively activating said up gate means and down gate means.

7. The data storage device of claim 5, wherein said down gate means, up gate means, and selective activating means comprise:
   charge source means for injecting charge into the conducting channel of each said first stage shift register;
   a first path for conducting and controlling charge injection from said source means, said path including a first aluminum electrode and a first silicon region;
   a second path for conducting and controlling charge injection from said source means, said path including a second aluminum electrode and a second silicon region;
   connection means for connecting the output end of each said second stage register to the said first silicon region of the first stage of the register pair respectively succeeding and adjoining each said second stage;
   connection means for connecting the output end of each said second stage register to the said second silicon region of the first stage of the register pair respectively preceding and adjoining each said second stage;
   a first control line connected to each said first aluminum electrode; and
   a second control line connected to each said second aluminum electrode.

8. The data storage device of claim 7, further including means for generating first and second control signals and wherein said means for entering data into said stack comprises: a data entry line;
   means actuable by said first control signal for entering data from said line into the first stage of the first said register pair in said stack and actuable by said second control signal for entering data from said line into the first stage of the second said register pair in said stack.

9. The data storage device of claim 8 wherein said means for entering data into said first register pair and said second register pair comprises:
   a first AND gate receiving inputs from said data entry line and said first control signal and having its output connected to the first silicon region of the first stage of said first register pair; and
   a second AND gate receiving inputs from said first register pair; and
   a second AND gate receiving inputs from said data entry line and said second control signal line and having its output connected to the second silicon region of the first stage of said second register pair.

10. The data storage device of claim 9 wherein said means for reading out the last data entered into said stack comprises:
    means actuable by said first control signal for reading out data from said first register pair and actuable by said second control signal for reading out data from said second register pair.

11. The data storage device of claim 10 wherein said means for reading data out of said first register pair and said second register pair comprises:

a third AND gate having inputs from the second stage output end of said first register pair and from said first control signal line;

a fourth AND gate having inputs from the second stage output end of said second register pair and from said second control signal line; and a first OR gate receiving inputs from the output of each of said third and fourth AND gates.

12. The data storage device of claim 11 wherein the said connection means for connecting the output end of the second stage of the said first register pair to the first silicon region of the first stage of the said second register pair further includes:

a fifth AND gate receiving inputs from the output of said second stage of said first register pair and from said first control signal line; and a second OR gate receiving inputs from the output of said fifth AND gate and the output of said second AND gate, said second OR gate having its output connected to the first silicon region of the first stage of said second register pair.

13. The data storage device of claim 12 wherein said means for reading out the first data entered into said stack comprises;

means actuable by said first control signal for reading data from the next to last register pair in said stack and actuable by said second control signal for reading data from the last register pair of said stack.

14. The data storage device of claim 13 wherein said means for reading data from said last and next to last registers pairs comprises:

a sixth AND gate having inputs from the second stage output end of the said next to last register pair and from said first control signal line;

a seventh AND gate having inputs from the output end of the said last register pair and from said second control signal line; and a third OR gate having inputs from the respective outputs of said sixth and seventh AND gates.

15. A data storage device comprising:

a stack of charge coupled device shift registers wherein data words are consecutively stored in serial order;

UP gate means for connecting the register storing the last bit of a data word to the register storing the first bit of the immediately preceding data word;

Down gate means for connecting the register storing the last bit of a data word to the register storing the first bit of the immediately succeeding data word;

intermediate gate means for connecting the registers intermediate the registers conaining the first and last bit of each data word to facilitate serial data transfer therebetween; and means for selectively enabling said up gate means and said down gate means.

16. In a memory comprising a stack of charge coupled device shift registers, apparatus for controlling entry of data bits in the form of charge packets into at least one of said registers comprising:

a source region;

a first conductive path interposed between said source region and the conducting channel of said at least one shift register, said path including at least one control region; and a second conductive path interposed between said source region and the conducting channel of said at least one shift register, said path including at least one control region.

17. The data entry control apparatus of claim 16 wherein said first conductive path includes a first aluminum control region and a first silicon control region and wherein said second conductive path includes a second aluminum control region and a second silicon control region.

18. A method of refreshing data stored in a series of shift registers wherein data bits are represented by the presence or absence of stored charge comprising the steps of:

shifting each of the data bits down in said stack while simultaneously regenerating each of said data bits; and subsequently shifting the data bits back up in said stack while simultaneously regenerating each of said data bits.

19. A method of refreshing data bits stored in a stack of charge coupled device shift registers including a plurality of regeneration means comprising the steps of:

shifting each of the data bits down in said stack and through at least one said regeneration means; and subsequently shifting the data bits back up in said stack and through at least one said regeneration means.

20. A method of refreshing data stored in the form of consecutively ordered words in a stack of charge coupled device shift registers each including regeneration means comprising the steps of:

shifting each data word down at least one word position in said stack and through at least one said regeneration means; and subsequently shifting each said data word back up at least one word position in said stack and through at least one said regeneration means.

* * * * *

UNITED STATES PATENT AND TRADEMARK OFFICE
CERTIFICATE OF CORRECTION

PATENT NO. : 3,975,717
DATED : August 17, 1976
INVENTOR(S) : Godavarish Panigrahi It is certified that error appears in the above-identified patent and that said Letters Patent are hereby corrected as shown below:

Col. 2, line 25 "adpats" should be --adapts--.
Col. 3, line 8 "simplifies" should be --simplified--;
Col. 3, line 21 "Fig. 5B" should be --4B--.
Col. 4, line 1 "kosonocky" should be --Kosonocky--;
Col. 4, line 43 "singals" should be --signals--.
Col. 7, line 19 "resion" should be --region--.
Col. 8, line 37 "99 95" should be --99, 95--.
Col. 9, line 10 "undirectionally" should be --unidirectionally--
Col. 10, lines 39-40 "secoond" should be --second--.

Col. 11, line 35 "osaid" should be --said--.
Col. 11, line 57 "shfit" should be --shift--;

Col. 11, line 61 "pairs" should be --paired--.

Signed and Sealed this

Twenty-eighth Day of December 1976

[SEAL]

Attest:

RUTH C. MASON
Attesting Officer

C. MARSHALL DANN
Commissioner of Patents and Trademarks